United States Patent
Yilmaz et al.

(10) Patent No.: US 7,210,981 B2
(45) Date of Patent: May 1, 2007

(54) SMART CONDITIONER RINSE STATION

(75) Inventors: Alpay Yilmaz, San Jose, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/273,766

(22) Filed: Nov. 14, 2005

(65) Prior Publication Data
US 2006/0270322 A1 Nov. 30, 2006

Related U.S. Application Data

(60) Provisional application No. 60/684,690, filed on May 26, 2005.

(51) Int. Cl.
*B24B 53/00* (2006.01)
(52) U.S. Cl. ............................................ 451/8; 451/72
(58) Field of Classification Search ................ 451/5, 451/8–11, 41, 56, 72, 443, 444
See application file for complete search history.

(56) References Cited

U.S. PATENT DOCUMENTS

| | | | |
|---|---|---|---|
| 6,293,853 B1 * | 9/2001 | Perlov et al. .................. 451/56 |
| 6,299,511 B1 * | 10/2001 | Gurusamy et al. ............ 451/56 |
| 6,319,105 B1 | 11/2001 | Togawa et al. |
| 6,322,434 B1 | 11/2001 | Satoh et al. |
| 6,517,414 B1 * | 2/2003 | Tobin et al. .................... 451/8 |
| 6,609,962 B1 * | 8/2003 | Wakabayashi et al. ...... 451/443 |
| 6,695,680 B2 * | 2/2004 | Choi et al. ..................... 451/5 |
| 6,722,948 B1 * | 4/2004 | Berman ........................ 451/21 |
| 6,755,718 B2 * | 6/2004 | Moore ............................ 451/5 |
| 7,056,190 B2 * | 6/2006 | Lee ................................ 451/5 |
| 2006/0035583 A1 | 2/2006 | Kalenian et al. |

FOREIGN PATENT DOCUMENTS

EP 1 270 148 A1 1/2003

OTHER PUBLICATIONS

PCT Partial International Search Report for International Application No. PCT/US2006/000736; International Filing Date Oct. 1, 2006.
PCT Inernational Written Opinion for PCT/US2006/000736, Dated Sep. 19, 2006.

* cited by examiner

*Primary Examiner*—Robert A. Rose
(74) *Attorney, Agent, or Firm*—Patterson and Sheridan

(57) ABSTRACT

A method and apparatus for monitoring polishing pad conditioning mechanisms is provided. In one embodiment, a semiconductor substrate polishing system includes a rinse station, a polishing surface, a conditioning element, and a conditioning mechanism. The conditioning mechanism selectively positions the conditioning element over the polishing surface and over the rinse station. At least one sensor is provided and is configured to detect a first position and a second position of the conditioning element when disposed over the rinse station.

31 Claims, 6 Drawing Sheets

SMART CONDITIONER RINSE STATION

CROSS-REFERENCE TO RELATED APPLICATION

This patent application claims benefit of U.S. Provisional Application Ser. No. 60/684,690, filed May 26, 2005, which is hereby incorporated by reference in its entirety.

BACKGROUND OF THE INVENTION

1. Field of the Invention

Embodiments of the present invention generally relate to a chemical mechanical polishing system. In particular, embodiments of the present invention relate to a method and apparatus for monitoring a polishing surface conditioning mechanism of a chemical mechanical polishing system.

2. Description of the Related Art

Chemical mechanical polishing is one process commonly used in the manufacture of high-density integrated circuits. Chemical mechanical polishing is utilized to planarize a layer of material deposited on a semiconductor substrate by moving the substrate in contact with a polishing surface while in the presence of a polishing fluid. Material is removed from the surface of the substrate that is in contact with the polishing surface through a combination of chemical and mechanical activity.

In order to achieve desirable polishing results, the polishing surface must be periodically dressed, or conditioned. One type of conditioning process, typically performed on the polyurethane polishing pads traditionally utilized in chemical mechanical polishing, is configured to restore the fluid retention characteristics of the polishing surface and to remove embedded material from the polishing surface. Another type of conditioning process, typically performed on fixed abrasive polishing materials, is configured to expose abrasive elements disposed within structures comprising the abrasive polishing material, while removing asperities from the upper surface of the polishing material and leveling the structures comprising the polishing surface to a uniform height.

In one embodiment, a polishing surface conditioner includes a replaceable conditioning element, such as a diamond disk, coupled to a conditioning head that is movable over the polishing surface. The conditioning element is lowered into contact with the polishing surface while being rotated. The conditioning head is generally swept across the rotating polishing surface to allow the conditioning element to condition a predefined area of the polishing surface.

Conventional conditioners commonly utilize diaphragms within the conditioning head to control the elevation of the conditioning element. A cavity behind the diaphragm is generally pressurized to lower the conditioning element and press it against the polishing surface of the polishing pad during conditioning. Upon completion of conditioning, the cavity is vented, allowing the conditioning element to retract, typically assisted by an upward spring bias.

The pressurization and the venting of the cavity causes the diaphragm to repeatedly stretch and relax. In addition, the raising and lowering of the conditioning element further applies stress to the diaphragm. However, the elastomeric diaphragm, like all other elastomeric materials have a finite life. Without repair or replacement, the eventual deterioration of the diaphragm leads to poor conditioning. To prevent the inevitable deterioration, the diaphragm is typically replaced on a set interval, for example after a preselected number of conditioning cycles. However, the conventional method is inefficient. Sometimes, the diaphragm will be replaced while it is still in good condition, causing unnecessary downtime and increasing costs. At other times, a diaphragm in poor condition is not replaced soon enough, causing poor conditioning of the pad.

Therefore, there is a need for a method and apparatus for monitoring pad conditioning mechanisms.

SUMMARY OF THE INVENTION

A method and apparatus for monitoring polishing pad conditioning mechanisms is provided. In one embodiment, an apparatus is provided for monitoring a conditioner that includes a sensor arranged to detect a performance attribute of a conditioning element when the conditioning element is not engaged with a processing pad. Performance attributes may include at least one of downforce, power transmission or condition of the conditioning surface, among other attributes that may affect conditioning performance.

In another embodiment, a semiconductor substrate polishing system includes a rinse station, a polishing surface, a conditioning element, and a conditioning mechanism. The conditioning mechanism selectively positions the conditioning element over the polishing surface and over the rinse station. At least one sensor is provided and is configured to detect a first position and a second position of the conditioning element when disposed over the rinse station.

In another embodiment, a semiconductor substrate polishing system having a polishing surface and a conditioning mechanism that is movable between a conditioning position disposed over the polishing surface and a non-conditioning position to the side of the polishing surface. The conditioning mechanism has a conditioning element for conditioning the polishing surface. A sensor is provided and is configured to detect a performance attribute of the conditioning element while in the non-conditioning position.

In another aspect of the invention, a method for characterizing a conditioning mechanism is provided. In one embodiment the method includes sensing a metric of a performance attribute of the conditioning mechanism and determining from the sensed metric is within a process window.

In another embodiment, a method for characterizing a component of a conditioning mechanism includes actuating a conditioning element of the conditioning mechanism to move between a first position and a second position. Next, the time required to actuate the conditioning element between the first position and the second position is analyzed.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements from one embodiment may be beneficially incorporated in other embodiments without further recitation.

DETAILED DESCRIPTION

Figure 1:
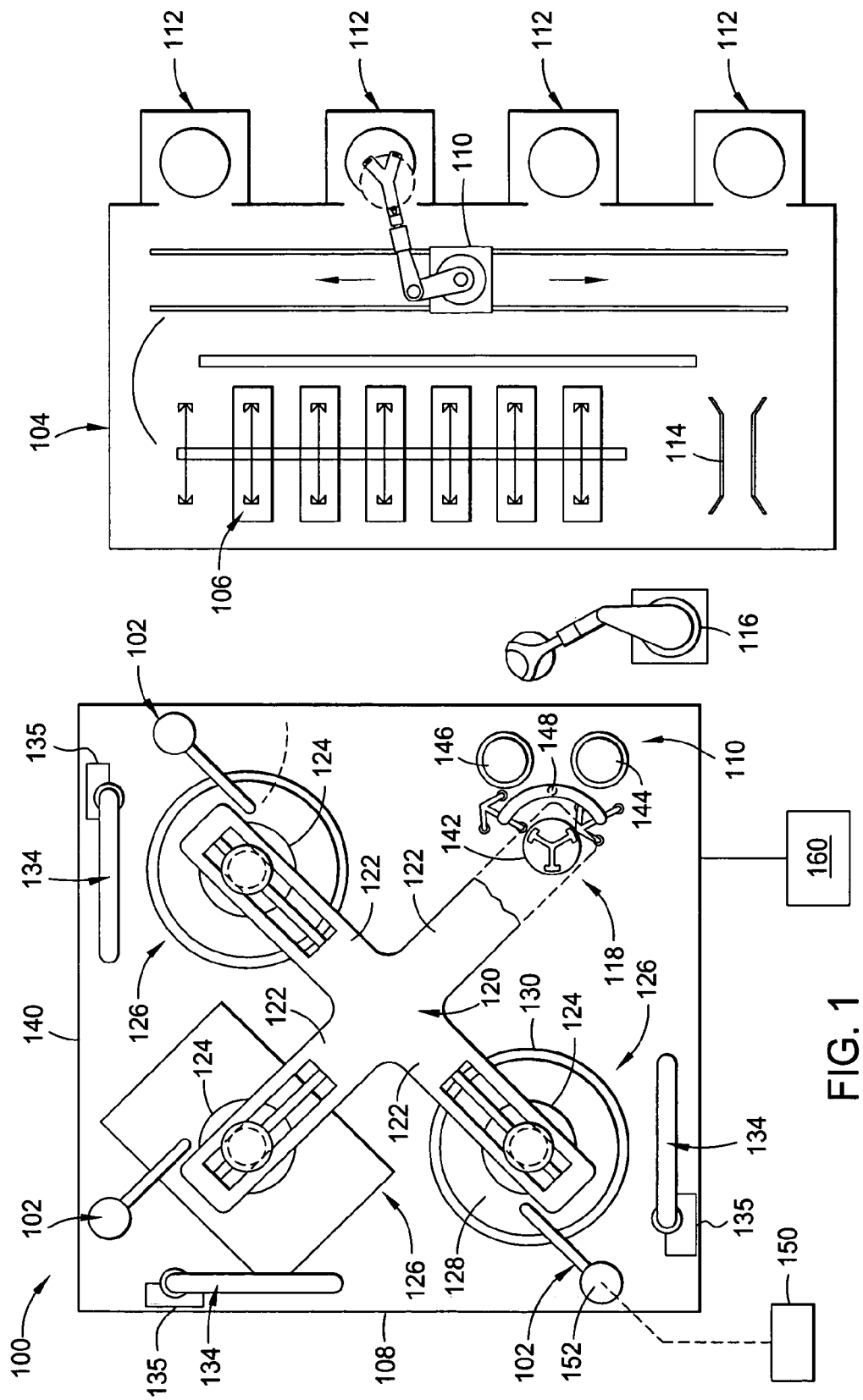
FIG. 1 is a top view of an illustrative polishing system having one embodiment of a rinse station for a conditioning mechanism.

FIG. 1 is a top view of an illustrative polishing system 100 having one embodiment of a rinse station 135 of the present invention. The polishing system 100 generally includes a factory interface 104, a cleaner 106 and a polisher 108. Two polishing systems that may be adapted to benefit from the invention is a REFLEXION® chemical mechanical polishing system and the REFLEXION LK Ecmp™, both available available from Applied Materials, Inc., located in Santa Clara, Calif. Another polishing system that may be adapted to benefit from the invention is described in U.S. Pat. No. 6,244,935, issued Jun. 12, 2001, to Birang, et al., entitled, "Apparatus and Methods for Chemical Mechanical Polishing with an Advanceable. Polishing Sheet," which is incorporated by reference in its entirety.

A controller 160 is provided to facilitate control and integration of the system 100. The controller 160 typically comprises a central processing unit (CPU), memory, and support circuits (not shown). The controller 160 is coupled to the various components of the system 100 to facilitate control of, for example, the planarizing, cleaning, and transfer processes.

In one embodiment, the factory interface 104 includes a first, or interface, robot 110 adapted to transfer substrates from one or more substrate storage cassettes 112 to a first transfer station 114. A second robot 116 is positioned between the factory interface 104 and the polisher 108 and is configured to transfer substrates between the first transfer station 114 of the factory interface 104 and a second transfer station 118 disposed on the polisher 108. The cleaner 106 is typically disposed in or adjacent to the factory interface 104 and is adapted to clean and dry substrates returning from the polisher 108 before being returned to the substrate storage cassettes 112 by the interface robot 110.

The polisher 108 includes at least one polishing station 126 and a transfer device 120 disposed on a base 140. In the embodiment depicted in FIG. 1, the polisher 108 includes three polishing stations 126, each having a platen 130 that supports a polishing material 128 on which the substrate is processed.

The transfer device 120 supports at least one polishing head 124 that retains the substrate during processing. In the embodiment depicted in FIG. 1, the transfer device 120 is a carousel supporting one polishing head 124 on each of four arms 122. One arm 122 of the transfer devices is cutaway to show the second transfer station 118. The transfer device 120 facilitates moving substrates retained in each polishing head 124 between the second transfer station 118 and the polishing stations 126 where substrates are processed. The polishing head 124 is configured to retain a substrate while polishing. The polishing head 124 is coupled to a transport mechanism that is configured to move the substrate retained in the polishing head 124 between the transfer station 118 and the polishing stations 126. One polishing head that may be adapted to benefit from the invention is a TITAN HEAD™ substrate carrier, available from Applied Materials, Inc.

The second transfer station 118 includes a load cup 142, an input buffer 144, an output buffer 146 and a transfer station robot 148. The input buffer 144 accepts a substrate being transferred to the polisher 108 from the second robot 116. The transfer station robot 148 transfers the substrate from the input buffer 144 to the load cup 142. The load cup 142 transfers the substrate vertically to the polishing head 124, which retains the substrate during processing. Polished substrates are transferred from the polishing head 124 to the load cup 142, and then moved by the transfer station robot 148 to the output buffer 146. From the output buffer 146, polished substrates are transferred to the first transfer station 114 by the second robot 116 and then transferred through the cleaner 106. One second transfer station that may be adapted to benefit from the invention is described in U.S. Pat. No. 6,156,124, issued Dec. 5, 2000 to Tobin, entitled, "Wafer Transfer Station for a Chemical Mechanical Polisher," which is incorporated by reference in its entirety.

A polishing fluid delivery system 102 includes at least one polishing fluid supply 150 coupled to at least one polishing fluid delivery arm assembly 152. Generally, each polishing station 126 is equipped with a respective delivery arm assembly 152 positioned proximate to a respective platen 130 to provide polishing fluid thereto during polishing. In the embodiment depicted in FIG. 1, the three polishing stations 126 each have one delivery arm assembly 152 associated therewith.

The platen 130 of each polishing station 126 supports a polishing material 128. During processing, the substrate is held against the polishing material 128 by the polishing head 124 in the presence of polishing fluid provided by the delivery system 102. The platen 130 rotates to provide at least a portion of the, polishing motion imparted between the substrate and the polishing material 128. Alternatively, the polishing motion may be imparted by moving at least one of the polishing head 124 or polishing material 128 in a linear, orbital, random, rotary or other motion.

The polishing material 128 may be comprised of a foamed polymer, such as polyurethane, a conductive material, a fixed abrasive material or combinations thereof. Fixed abrasive material generally includes a plurality of abrasive elements disposed on a flexible backing. In one embodiment, the abrasive elements are comprised of geometric shapes formed from abrasive particles suspended in a polymer binder. The polishing material 128 may be in either pad or web form.

A conditioning mechanism 134 is disposed proximate each polishing station 126 and is adapted to dress or condition the polishing material 128 disposed on each platen 130. Each conditioning mechanism 134 is adapted to move between a position clear of the polishing material 128 and platen 130 as shown in FIG. 1, and a conditioning position over the polishing material 128. In the conditioning position, the conditioning mechanism 134 is actuated to engage the polishing material 128 and works the surface of the polishing material 128 to a state that produces desirable polishing results. In the position clear of the polishing material 128 and the platen 130, the conditioning mechanism 134 is positioned to engage with the rinse station 135.

Figure 2:
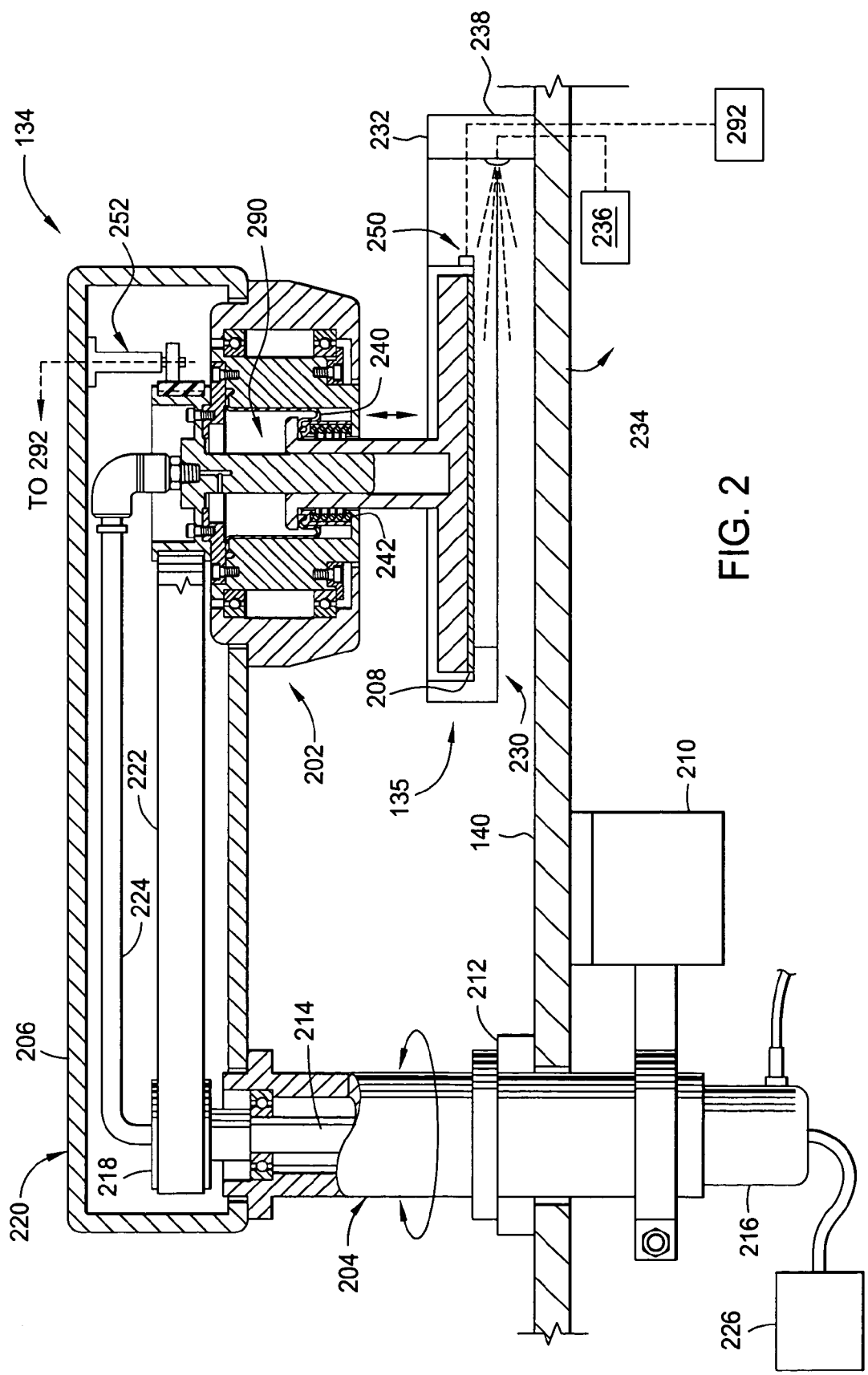
FIG. 2 is a sectional side view of one embodiment of the conditioning mechanism and rinse station of FIG. 1.

FIG. 2 is a sectional view of one embodiment of the conditioning mechanism 134 engaged within the rinse station 135. The conditioning mechanism 134 generally includes a head assembly 202 coupled to a support member 204 by an arm 206. The support member 204 is disposed through the base 140 of the polisher 108. Bearings 212 are provided between the base 140 and the support member 204 to facilitate rotation of the support member 204. An actuator 210 is coupled between the base 140 and the support member 204 to control the rotational orientation of the support member 204. The actuator 210, such as a pneumatic cylinder, servo motor, motorized ball screw, harmonic drive or other motion control device that is adapted to control the rotational orientation of the support member 204, allows the arm 206 extending from to the support member 204 to be rotated about the support member 204, thus laterally positioning the head assembly 202 relative to the polishing station 126. A conditioning element 208 is coupled to the bottom of the head assembly 202 and may be selectively pressed against the platen 130 to condition the polishing material 128.

The elevation of the conditioning element 208 is generally controlled by pressurizing an expandable cavity 290 partially bounded by a diaphragm 240 disposed in head assembly 202. A spring 242 disposed in the head assembly 202 provides an upward bias that assists in the retraction of the conditioning element 208 when the cavity 290 behind the diaphragm 240 is vented or evacuated. Examples of conditioning mechanisms suitable for use with the present invention are described in U.S. patent application Ser. No. 10/411, 752, filed Apr. 10, 2003 by Lischka, et al., entitled "Conditioner Mechanism for Chemical Mechanical Polishing," and U.S. Pat. No. 6,572,446, issued Jun. 3, 2003 to Osterheld, et al., entitled "Chemical Mechanical Polishing Pad Conditioning Element with Discrete Points and Compliant Membrane," each of which are hereby incorporated by reference. Although the conditioning head assembly 202 depicted in FIG. 2 shows a rolling diaphragm 240 and a spring 242, it is contemplated that conditioning head assemblies 202 utilizing other actuating mechanisms, such as full diaphragms, belts, springs, actuators, and the like, may be characterized in the rinse station 135, as further discussed below. Moreover, it is contemplated that teachings disclosed herein may be utilized to characterize components in other processing equipment, for example, the diaphragms and/or bladders in the polishing head 124, or other components subject to wear over its service life.

The support member 204 houses a drive shaft 214 that couples a motor 216, disposed below the base 140, to a pulley 218 disposed adjacent a first end 220 of the arm 206. A belt 222 is disposed in the arm 206 and operably couples the pulley 218 and the head assembly 202, thereby allowing the motor 216 to selectively rotate the conditioning element 208. The belt 222 is contemplated as any member adapted to transfer rotational motion between the motor 216 and the head assembly 202.

A control fluid conduit 224 from a fluid control system 226 is routed through the support member 204 and arm 206, and is coupled to the head assembly 202. The fluid control system 226 includes a gas supply and various control devices (i.e., valves, regulators, and the like) that facilitate the application and/or removal of fluid pressure to the cavity 290 of the head assembly 202. In one embodiment, the fluid control system 226 provides air or nitrogen to control the elevation of the conditioning element 208 relative to the platen 130 (or base 140), and to control the pressure applied by the conditioning element 208 against the polishing material 128 during conditioning (e.g., down force of the conditioning head).

The conditioning element 108 is moved to the rinse station 135 when not in use. The rinse station 135 generally includes a body 230, one or more sensors 250, and a rinse nozzle 234. In one embodiment, the body 230 is held in position above the base 140 by a support 238. The body 230 may be coupled directly to the support 238. Alternatively, the body 230 may be coupled to the support 238 through a mounting plate 232. Having the body 230 raised above the base 140 facilitates drainage of fluids and removal of other debris as the conditioning element 208 is rinsed as described further below.

The one or more sensors 250 are provided to detect a metric of conditioner performance. Some metrics of conditioner performance that may be sensed include conditioner downforce, attributes of the conditioning surface, power transmission (such as for conditioner rotation), seal and diaphragm performance and rinse fluid flow, among others. In one embodiment, sensors 250 are configured to sense the position of the conditioning element 208 at multiple predefined positions of extension with respect to the head assembly 202. The sensors 250 may be positioned anywhere suitable for detecting the position of the conditioning element 208 at the predefined locations. Alternatively, one or more of the sensors 250 may be located in a position remote from the rinse station 135. For example, one or more sensors 250 may be positioned in or on the head assembly 202, the arm 206, the base 140, or other location suitable for sensing the position of the conditioning element 208 with respect to the head assembly 202. In the embodiment depicted in FIG. 2, at least one sensor 250 is coupled to the body 230.

The rinse nozzle 234 provides a cleaning fluid from a fluid source 236 to rinse, or clean, the working surface of the conditioning element 208. The nozzle 234 is positioned to effectively rinse the conditioning element 208 and/or other components of the head assembly 202. In one embodiment, the rinse nozzle 234 is disposed to the mounting plate 232.

Figure 3A:
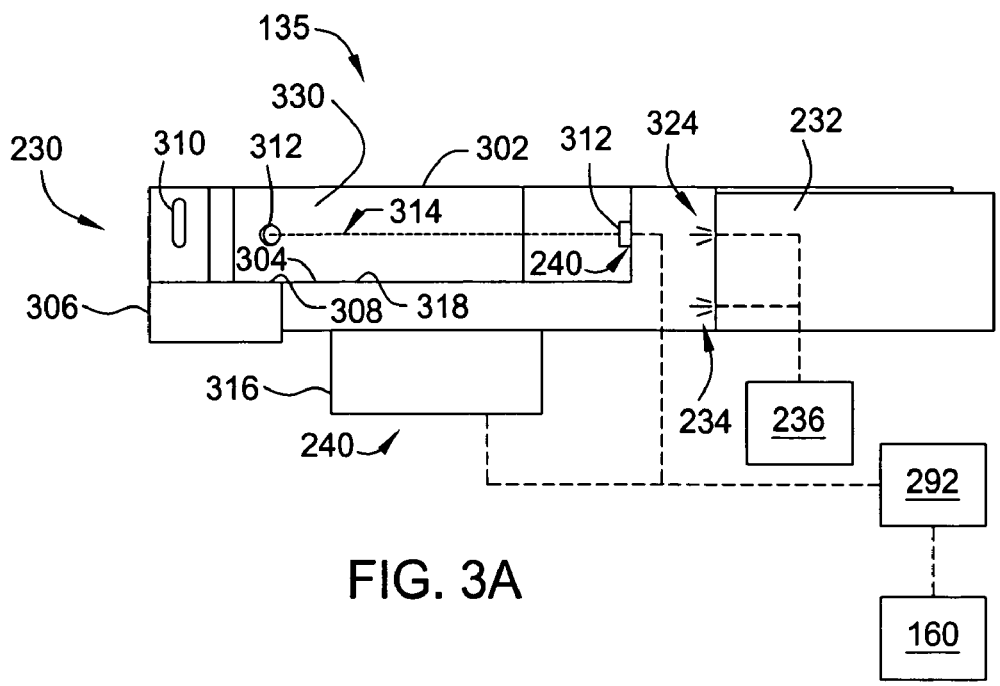
FIGS. 3A and 3B respectively depict a side and top view of one embodiment of a rinse station.
Figure 3B:
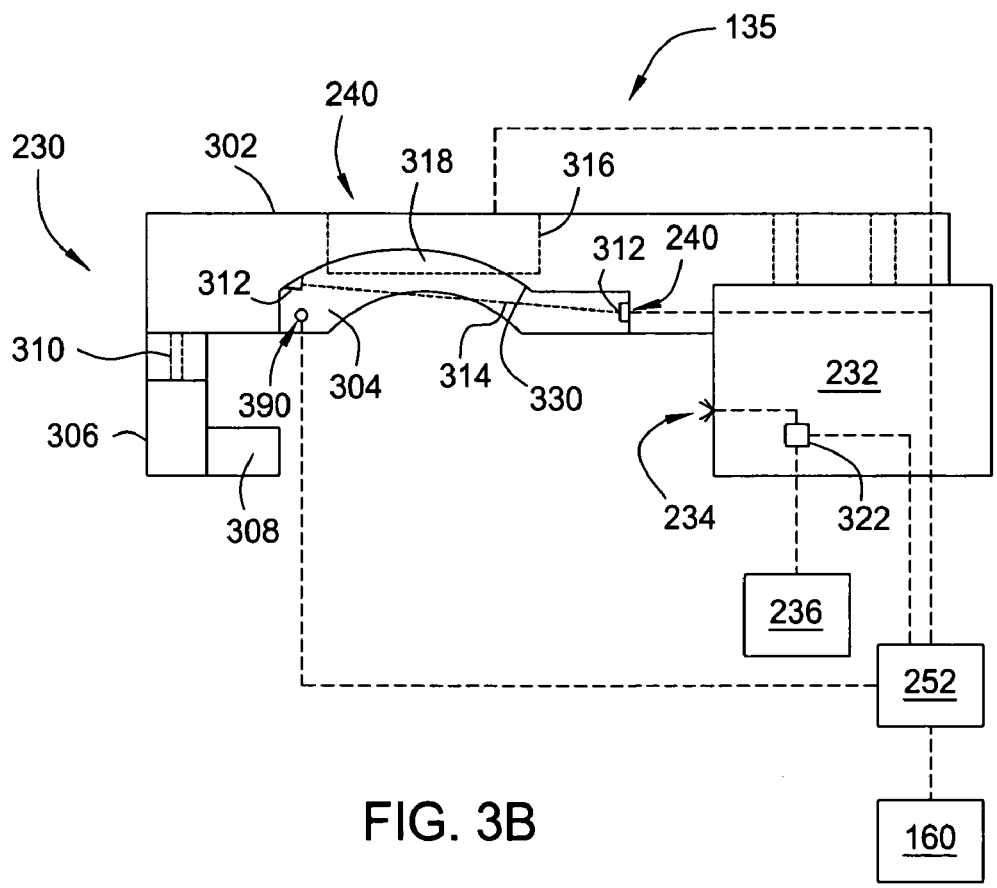

FIGS. 3A and 3B respectively depict side and top views of one embodiment of the rinse station 135. The body 230 of the rinse station 135 includes an arm 302 and a bracket 306. The arm 302 may be coupled to the mounting plate 232 in any suitable manner, for example, by a plurality of screws (not shown). The arm 302 includes a contoured inner edge 330 and a ledge 304. The inner edge 330 is contoured to allow clearance of the conditioning element 208 when engaged with the rinse station 135 (as depicted in FIG. 2). The ledge 304 provides a hard stop for the conditioning element 208 when lowered into the rinse station 135. Thus, when the conditioning element 208 is positioned in the rinse station 135, the conditioning element 208 is disposed proximate the inner edge 330 of the arm 302 and may contact the ledge 304 when lowered. The ledge 304 is typically contoured to allow the conditioning element 208 to be rinsed by the rinse arm 234 (i.e., the ledge 304 is cut away to expose substantially all of the bottom of the conditioning element 208.

Optionally, one of the sensors 250 for characterizing conditioner performance may be a sensor 390 disposed in the ledge 304 suitable for detecting a metric of conditioning downforce. Thus, as the conditioning element 208 is actuated against the ledge 304, the sensor 390 may provide the controller with a metric indicative of downforce which may be compared with an expected value or a process window. If the sensed downforce is outside of the process window and/or a value different than an expedited value, the controller may flag the event, notify the operator or interrupt processing operations. The data provided by the sensor 390 may also be used to trend performance to predict or monitor service life. Moreover, the downforce sensor 390 will allow the detection of seal and/or diaphragm leaks, pressure supply draft and the like by providing data that enables the detection of force changes over time.

Optionally, instead of providing characterizing information directly to the controller 160, a dedicated PLC 292 or other computing device may monitor the sensors 250. The PLC 292 may have an output coupled to the controller 160 to flag potential conditioner performance issues that have been identified as triggers for the controller to halt and/or alter conditioning and/or substrate process.

Also depicted in the embodiment of FIG. 2 are one or more sensors 250 that include a first sensor 312 disposed on the inner edge 330 of the arm 302, and a second sensor 316 is coupled to a bottom surface of the arm 302. The sensors 250 may comprise any suitable sensor for detecting the position of the conditioning element 208. In one embodiment, the first sensor 312 is a break-through sensor configured to transmit and receive a beam of light (as indicated by dashed line 314) for sensing when an interposing object (i.e., the conditioning element 208) is positioned therebetween.

In one embodiment, the second sensor 316 is a proximity sensor positioned beneath a portion 318 of the ledge 304. The proximity sensor, or second sensor 316, detects when the conditioning element 208 is disposed within a predefined distance from or on the portion 318 of the ledge 304.

The sensors 312, 316 are generally coupled to the PLC 292 or other device suitable for recording the data obtained by the sensors such as a strip chart recorder or memory module. By detecting the position of the conditioning element 208 at various locations in the rinse station 135, a plurality of characterizations of the conditioning mechanism 134 may be advantageously performed, as described in more detail below.

The bracket 306 is adjustably coupled to the arm 302 in any suitable manner, for example, by a screw or bolt (not shown) disposed through an elongated slot 310. The adjustment of the bracket 306 allows alignment of a support ledge 308 formed in the bracket 306 with the ledge 304 of the arm 302, thereby providing an extended support area for the conditioning element 208 of the head assembly 202 when positioned in the rinse station 135. The extended support area prevents uneven forces from being applied to the components of the head assembly 202 when the conditioning element 208 is lowered and pressed against the ledge 304.

In another embodiment, the sensor 390 may be configured to provide a metric indicative of a surface condition of the conditioning element 208. For example, the sensor 390 may be a roughness sensor for monitoring the surface condition of the conditioning element. In another example, the sensor 390 may be a camera for visually monitoring the surface condition of the conditioning element 208. It is contemplated that images from the surface of the conditioning element 208 may be electronically analyzed to determine the state of the condition, such as missing diamond or abrasives, and the like. It is also contemplated that the sensor 390 may be configured to provide a metric indicative of the cut rate the conditioning element 208.

The rinse nozzle 234 is positioned to supply a stream of rinsing and/or cleaning fluid to the bottom surface of the conditioning element 208 and/or head assembly 202. In one embodiment, the rinse nozzle 234 is coupled to the mounting plate 232 in a suitable manner, such as by threaded engagement. The configuration and position of the nozzle 234 is selected to direct the flow of fluid to a desired location on the conditioning element 208 when the head assembly 202 is disposed in the rinse station 135. The nozzle 234 is coupled to the fluid source 236. It is contemplated that the rinse nozzle 234 may alternatively be coupled to different components of the polishing system 100, such as the base 140, so long as it is disposed in a position suitable for delivering a stream of rinsing and/or cleaning fluid to the conditioning element 208 and/or head assembly 202.

Optionally, additional nozzles may be formed in the member 320 or other location in the rinse station 135 and coupled to the fluid source 236. For example, in the embodiment depicted in FIGS. 3A and 3B, a second nozzle 324 is formed in the mounting plate 232 and is positioned to spray rinsing and/or cleaning fluid along the periphery of the conditioning element 208 and/or the head assembly 202.

In one embodiment, one of the sensors 250 for characterizing the conditioner may be positioned to detect the flow of cleaning fluid into the rinse station 135. For example, in the embodiment depicted in FIG. 3B, a sensor 322, such as a flow sensor, may be interfaced with the conduits providing fluid to the nozzle 234 and configured to provide a metric of flow in the rinse station 135, thereby providing the PLC 292 an indication whether the conditioning element 208 is being rinsed as expected.

In yet another embodiment, one of the sensors 250 for characterizing the conditioner may be positioned to detect the rotational motion of the conditioning element. For example, in the embodiment depicted in FIG. 2B, a sensor 252, such as a rotary sensor, may be interfaced with the belt 222 and/or head assembly 202 or other component and configured to provide a metric indicative of the rotation of the conditioning element 208, thereby providing the PLC 292 an indication that the conditioning element 208 rotating in a predetermined manner.

In operation, the conditioning mechanism 134 is rotated to place the head assembly 202 and conditioning element 208 above the rinse station 135. A cleaning fluid may be supplied from the nozzles 322 and 324 to remove any debris disposed on the surface of the conditioning element 208 and/or head assembly 202 (for example, polishing slurries, particulate matter, and the like).

The conditioning element 208 may further be lowered into contact with the ledges 304, 308 of the rinse station 135 via pressurization of the cavity 290 (depicted in FIG. 2). As the conditioning element 208 is lowered, the PLC 292 records data corresponding to when the first sensor 312 detects the position of the conditioning element 208 (e.g., when the beam 314 is broken). The PLC 292 further records data corresponding to when the conditioning element 208 contacts the ledge 304, as detected by the second sensor 316.

By comparing the data recorded when the conditioning element 208 passes the first sensor 312 and the second sensor 316, a time to move the conditioning element 208 downwards between a known distance (i.e., between the sensors 312, 316) may be obtained. The time may be compared to a predefined amount of time or the time may be charted over a period of multiple cycles to monitor trends in the time to actuate the conditioning element 208 downwards.

Characterization of the conditioning elements movement relative the rinse station 135 may also be obtained by utilizing one or more parameters such as time between commencing the heat movement conditioning elements (i.e., the pressurization of the cavity 290), cavity pressure and/or rate of change at different elevations and the like. Additionally, the bottom surface of the conditioner may be monitored for cleanliness, damage and/or for wear. Furthermore, operational aspects of the conditioner, such as downforce, rotational speed, cut rate and cleanliness, which may be compared to a process window so that the conditioner may be recleaned or surface prior to conditioning the polishing surface, thereby preventing process abnormalities.

Figure 4A:
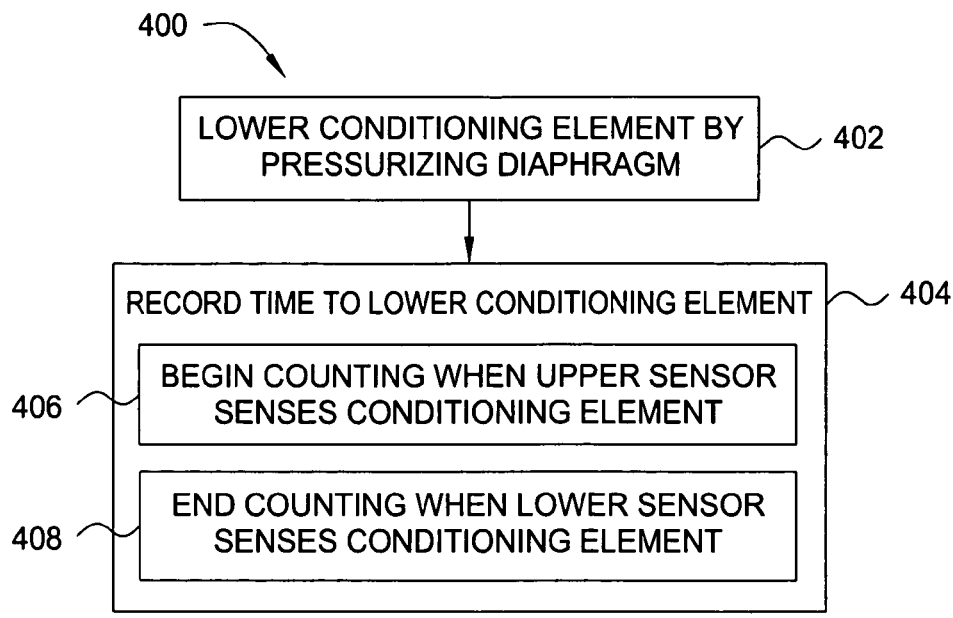
FIGS. 4A, 4B and 4C depict methods of use of the rinse station.

For example, FIG. 4A depicts a method 400 for monitoring a conditioning mechanism, described with reference to the apparatus depicted in FIGS. 2 and 3A–B. The method 400 begins at step 402, where the conditioning element 208 is lowered into the rinse station 135 by pressurizing the cavity 290. The method continues at step 404, where the time required to lower the conditioning element 208 into within a predetermined distance of the ledge 304 is recorded. The recorded time may be the time between commencement of cavity pressurization and sensor trigger.

In one embodiment, step 404 includes substep 406, where a timer begins counting when the first sensor 312 senses the conditioning element 208 (e.g., when the conditioning element 208 breaks the beam of light 314 between the emitter and receiver pair of the first sensor 312). At substep 408, the timer stops counting when the second sensor 316 detects the conditioning element 208 on the ledge 304. Alternatively, a start time may be recorded in step 406 and a stop time recorded in step 408, with the time required to lower the conditioning element 208 calculated by subtracting the start time from the stop time.

In other embodiments, the sensors 312, 316 may detect alternate positions of the conditioning element 208. For example, the sensors 312, 316 or the method may be configured to record the time required to raise the head assembly 202. Alternatively or in addition, the sensor 252 may be utilized to detect the rotation of the conditioning element 208. By recording a time required to raise, lower, or rotate the conditioning element 208, the condition of the diaphragm, springs, or other components of the head assembly 202 of the conditioning mechanism 134 may be monitored.

Figure 4B:
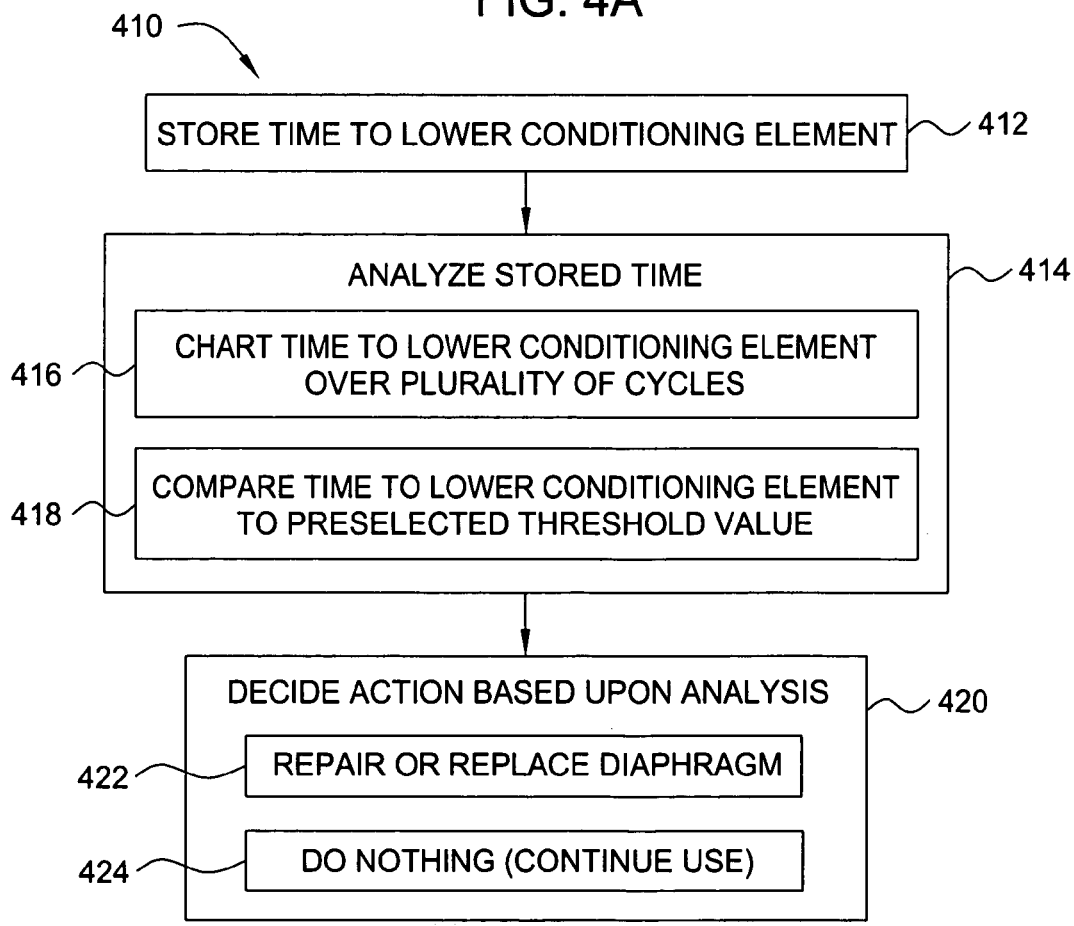

In another example, FIG. 4B depicts a method 410 for monitoring a conditioning mechanism, described with reference to the apparatus depicted in FIGS. 2 and 3A–B. The method 410 begins at step 412, when the time required to lower the conditioning element 208 is stored, for example, in a database. Next, at step 414, the time required to lower the conditioning element 208 is analyzed. The time required to lower the conditioning element 208 may be analyzed in many different ways. For example, at substep 416, the time required to lower the head assembly may be charted over a plurality of cycles in order to determine or monitor trends in the variation of the time required to lower the conditioning element 208. Alternatively or in combination, substep 418 may be utilized to compare the time required to lower the conditioning element 208 to a preselected threshold value.

Next, at step 420, a course of action is decided upon based on the analysis of step 414. For example, at step 422, a decision may be made to repair or replace the diaphragm 240 of the head assembly 202. Alternatively, the analysis may indicate that the diaphragm 240 is still in acceptable condition and may be continued to be used, as depicted in substep 424. The decision made in step 420 may be made in a variety of ways.

For example, in embodiments where the time required to lower the conditioning element 208 is charted over a plurality of cycles, as in substep 416, the decision may be made based upon changes in the slope of the charted curve, which may indicate a more rapid deterioration in the condition of the diaphragm 240. Alternatively, before substep 418 is used, a preselected threshold value may be utilized in comparison to the time required to lower the conditioning element 208, such that if the time required to lower the conditioning element 208 exceeds the threshold value, it is indicative of the deterioration of the diaphragm 240 to the point where its replacement is required.

It is contemplated that step 412 and substep 416 of the method 410 may be omitted. For example, the method 410 may comprise merely comparing the time required to lower the conditioning element 208 to a preselected threshold value, as in substep 418, without the need for reference to previous values and thus, the need to store the time required to lower the conditioning element 208, or to chart the time over a plurality of cycles.

Figure 4C:
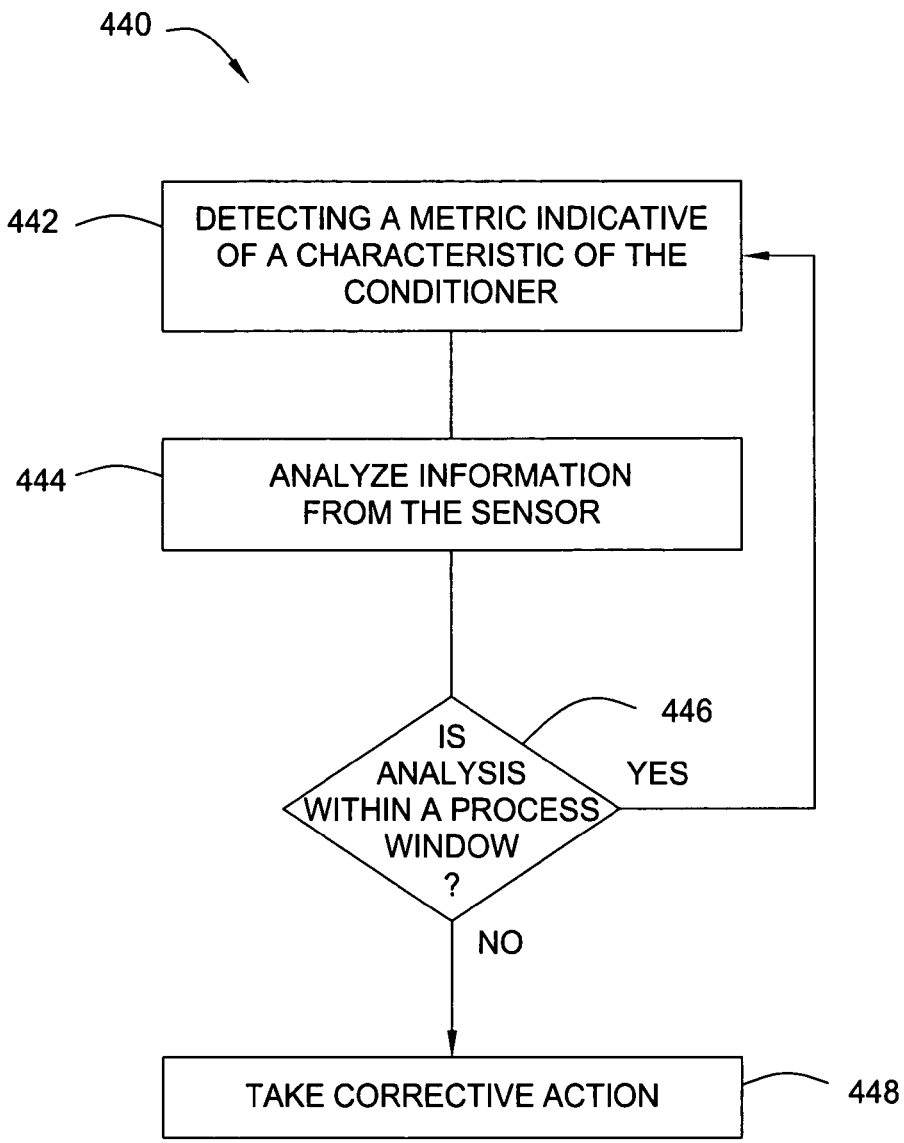

FIG. 4C is a flow diagram of another method 440 for monitoring a conditioning mechanism. The method 440 begins at step 442 by detecting a metric indicative of a characteristic of the conditioning mechanism 134. The metric may be provided to the controller 160 and/or PLC 292 tasked with monitoring conditioner function and/or performance from one or more of the sensors as described above. At step 444, the metric and/or information derived from the sensor is analyzed. The analysis may include determining if the characteristic is within a processing window, determining if maintenance is required, determining a wear rate of a component, determining an arrival of a need for maintenance based an a wear rate, determining if the conditioning element 208 needs replacement, determining if power transmission parts (e.g., belts, bearing, etc.) need service, should be re-cleaned determining if the conditioning element 208 should be re-cleaned, determining if the cleaning of the conditioning element is operating within specification, and determining if conditioning operations need to be suspended or modified. It is contemplated that many other performance/conditioner health indicators may be monitored. At step 446, if the analysis indicates that the sensed metric is out of specification or outside a process window, corrective action is taken at step 448. Examples of corrective action include flagging a need for maintenance and/or component replacement, adjusting downforce pressure, adjusting rotational speed, adjusting a pad conditioning routine for a change in conditioner cut-rate, unclogging a fluid line, re-cleaning the conditioning element, predicting a need for future maintenance, and flagging potential conditioning abnormalities, among others. If, at step 446, the analysis indicates that performance is within specification, then the method returns to step 442 to continuing to monitoring the conditioning mechanism 134.

Figure 5:
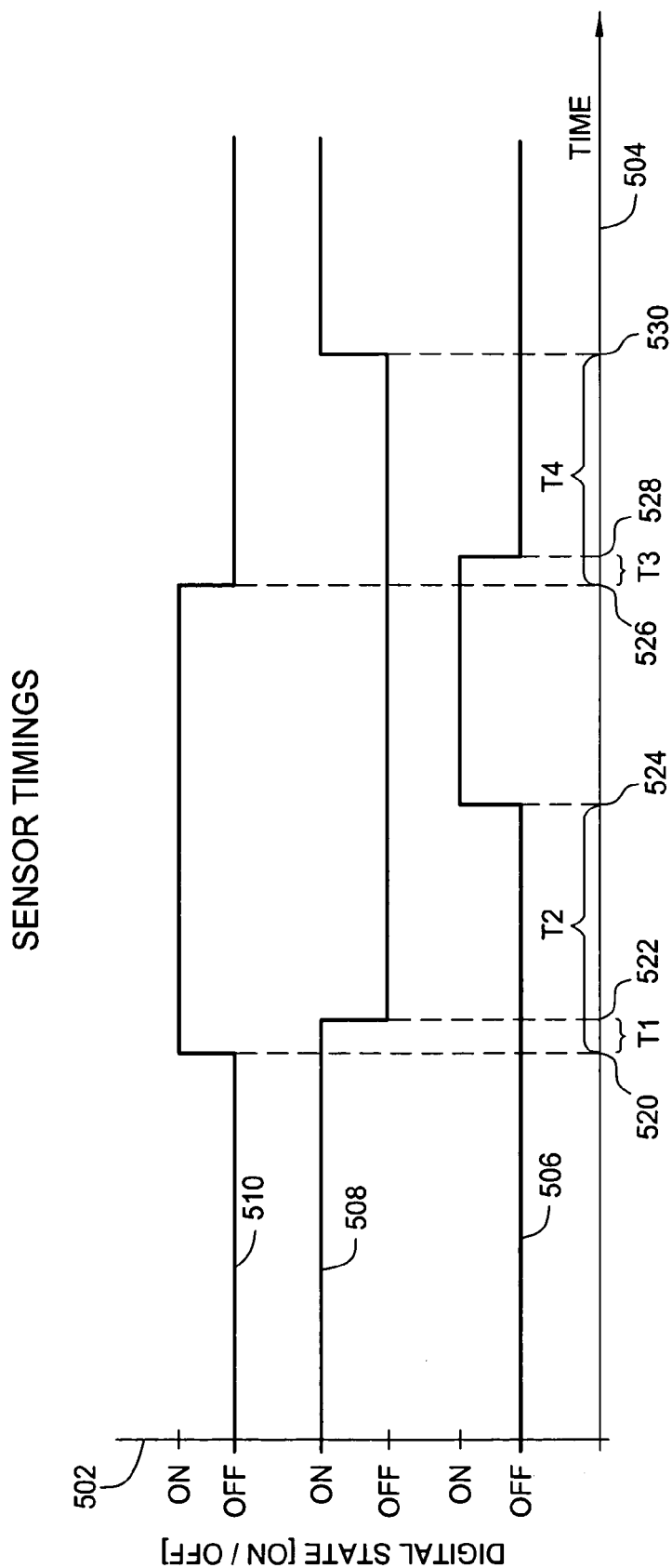
FIG. 5 is a chart depicting sensor timings for the rinse station.

FIG. 5 depicts a graph of sensor timings showing additional variables that may be monitored, recorded, charted, and the like to further characterize critical components of the conditioning mechanism 134. FIG. 5 depicts the digital states, i.e., "on" or "off," (along an axis 502) over time (along an axis 504) for the first sensor (line 506), second sensor (line 508), and the pressure command (line 510).

The pressure command is the instruction to pressurize or exhaust the diaphragm 240 to raise or lower the conditioning element 208. The graph arbitrarily starts with the conditioning element 208 lowered and disposed against the ledge 304. At time 520, the state of the pressure command is switched from off to on, correlating with a command to raise the conditioning element 208. At time 522, the state of the second sensor 316 changes from on to off, indicating that the conditioning element 208 has begun to rise and is no longer on the ledge 304. At time 524, the state of the first sensor 312 changes from off to on, indicating that the conditioning element 208 has passed the first sensor 312.

The time period between the change in state of the pressure command and the change in state of the second sensor 316 is labeled T1. T1 is indicative of the amount of time it takes between the issuance of the command to raise the conditioning element 208 and the lift off of the conditioning element 208 from the ledge 304. The time period between the change in state of the pressure command and the change in state of the first sensor 312 is labeled T2. T2 is indicative of the amount of time it takes between the issuance of the command to raise the conditioning element 208 and the arrival of the conditioning element 208 at an upper position proximate the first sensor 312. The time difference between T2 and T1 is indicative of the amount of time actually required for the conditioning element 208 to travel between the lower position on the ledge 304 and the upper position proximate the first sensor 312.

At time 526, the state of the pressure command is switched from on to off, correlating with a command to lower the conditioning element 208. At time 528, the state of the first sensor 312 changes from on to off, indicating that the conditioning element 208 has begun to descend and is no longer proximate the first sensor 312. At time 530, the state of the second sensor 316 changes from off to on, indicating that the conditioning element 208 has contacted the ledge 304.

The time period between the change in state of the pressure command and the change in state of the first sensor 312 is labeled T3. T3 is indicative of the amount of time it takes between the issuance of the command to lower the conditioning element 208 and the descent of the conditioning element 208 from the position proximate the first sensor 312. The time period between the change in state of the pressure command and the change in state of the second sensor 316 is labeled T4. T4 is indicative of the amount of time it takes between the issuance of the command to lower the conditioning element 208 and the arrival of the conditioning element 208 on the ledge 304. The time difference between T4 and T3 is indicative of the amount of time actually required for the conditioning element 208 to travel between the upper position proximate the first sensor 312 and the lower position on the ledge 304.

Any one or a combination of these time periods may be monitored and/or charted over time as described above with respect to FIGS. 4A and 4B in order to determine whether the diaphragm 240 requires repair or replacement. Alternatively, other motions may be monitored, such as the rotation of the head assembly 202, in order to characterize the condition of the desired critical components.

Thus, methods and apparatus for monitoring a conditioning mechanism are provided. In one embodiment a smart rinse station is provided to clean the conditioning mechanism when not in use and to characterize critical components of the conditioning mechanism, such as a diaphragm, springs, and the like. The conditioning mechanism may be characterized over time to detect trends or in comparison to preselected threshold values in order to detect deterioration in the performance of the conditioning mechanism and to prevent poor conditioning. Although the above apparatus and methods are described with respect to a conditioning mechanism, it is contemplated that the above teachings may be modified for use in monitoring and characterizing critical components in other systems as well.

While the foregoing is directed to embodiments of the present invention, other and further embodiments of the invention may be devised without departing from the basic scope thereof, and the scope thereof is determined by the claims that follow.

The invention claimed is:

1. A semiconductor substrate polishing system, comprising:
   a polishing surface;
   a conditioning element;
   a conditioning mechanism for selectively positioning the conditioning element over the polishing surface; and
   at least one sensor positioned to sense an attribute of the conditioning mechanism, wherein the attribute is indicative of performance of the conditioning element, and the at least one sensor is disposed in a rinse station.

2. The system of claim 1, wherein the at least one sensor is configured to detect a first position and a vertically offset second position of the conditioning element.

3. The system of claim 1, wherein the rinse station is laterally disposed from the polishing surface, and the conditioning mechanism is further configured to selectively position the conditioning element proximate the rinse station.

4. The system of claim 3, wherein the rinse station further comprises:
   a rinse nozzle configured to spray a fluid on the conditioning element.

5. The system of claim 1, wherein the at least one sensor further comprises:
   a first sensor configured to detect a first position of the conditioning element; and
   a second sensor configured to detect a second position of the conditioning element.

6. The system of claim 1, wherein the at least one sensor is configured to detect rotation of the conditioning element.

7. The system of claim 1, wherein the at least one sensor is configured to detect downforce of the conditioning element.

8. The system of claim 1, wherein the at least one sensor is configured to provide a metric indicative of a conditioning surface of the conditioning element.

9. The system of claim 8, wherein the metric indicative of the conditioning surface is at least one of cut-rate, cleanliness, conditioning element wear or damage.

10. The system of claim 4, wherein the at least one sensor is configured to provide a metric indicative of a fluid flow through the rinse nozzle.

11. The system of claim 1 further comprising:
    a controller coupled to the at least one sensor and containing instructions for characterizing health of the conditioning element.

12. A semiconductor substrate polishing system having a polishing surface, comprising:
    a conditioning mechanism movable between a conditioning position disposed over the polishing surface and a non-conditioning position to the side of the polishing surface, the conditioning mechanism having a conditioning element for conditioning the polishing surface; and
    a station disposed laterally from the polishing surface and beneath the non-conditioning position of the conditioning element, the station comprising:
      a body;
      a first sensor coupled to the body and configured to detect a first position of the conditioning element; and
      a second sensor coupled to the body and configured to detect a second position of the conditioning element.

13. The system of claim 12 further comprising:
    a nozzle disposed in the station and arranged to direct a fluid to a bottom surface of the conditioning element.

14. The system of claim 13 further comprising:
a third sensor configured to provide a metric indicative of a fluid flow through the nozzle.

15. The system of claim 13 further comprising:
a third sensor configured to provide a metric indicative of downforce of the conditioning element.

16. The system of claim 13 further comprising:
a third sensor configured to provide a metric indicative of rotation of the conditioning element.

17. A rinse station for a conditioning mechanism, comprising:
a body configured to engage with a conditioning element of the conditioning mechanism;
a rinse nozzle disposed in the body and configured to spray a fluid on the conditioning element when the conditioning element is engaged with the rinse station; and
at least one sensor coupled to the body and configured to detect a performance attribute of the conditioning element.

18. The rinse station of claim 17, wherein the at least one sensor further comprises at least one of a force sensor, a flow detection sensor, a cut-rate sensor, a rotation sensor, or a sensor suitable for providing an image of the conditioning element.

19. The rinse station of claim 17, wherein the at least one sensor further comprises:
a first sensor configured to detect a first position of the conditioning element; and
a second sensor configured to detect a second position of the conditioning element.

20. A semiconductor substrate polishing system having a polishing surface, comprising:
a conditioning mechanism movable between a conditioning position disposed over the polishing surface and a non-conditioning position to a side of the polishing surface, the conditioning mechanism having a conditioning element for conditioning the polishing surface;
a rinse station disposed laterally from the polishing surface and beneath the non-conditioning position of the conditioning element, the rinse station comprising:
a body;
a rinse arm having a nozzle configured to spray a fluid on the conditioning element;
a first sensor coupled to the body and configured to detect a first position of the conditioning element; and
a second sensor coupled to the body and configured to detect a second position of the conditioning element; and
a controller coupled to the first sensor and the second sensor, the controller containing instructions to characterize the motion of the conditioning element.

21. A method for characterizing a component of a conditioning mechanism, comprising:
actuating a conditioning element of the conditioning mechanism to move between a first position and a second position; and
analyzing an actuation time required to move the conditioning element between the first position and the second position.

22. The method of claim 21, wherein the analyzing step further comprises:
comparing the actuation time to a predetermined time.

23. The method of claim 21, wherein the analyzing step further comprises:
determining, from trends or deviations from a historical database of actuation times, a need to service the conditioning mechanism.

24. A method for characterizing a component of a conditioning mechanism, comprising:
interfacing a conditioning mechanism disposed in a non-conditioning position with one or more sensors, wherein the one or more sensors are positioned in a rinse station disposed approximate the conditioning mechanism;
obtaining a metric indicative of conditioning mechanism performance from the one or more sensors; and
determining if the metric of performance is within a process window.

25. The method of claim 24, wherein the obtaining the metric indicative of conditioning mechanism performance further comprises detecting a rotation of the conditioning mechanism.

26. The method of claim 24, wherein the obtaining the metric indicative of conditioning mechanism performance further comprises detecting a flow of a cleaning fluid into the conditioning mechanism.

27. The method of claim 24, wherein the obtaining the metric indicative of conditioning mechanism performance further comprises detecting a downforce of the conditioning mechanism.

28. The method of claim 24, wherein the obtaining the metric indicative of conditioning mechanism performance further comprises detecting a cut-rate of the conditioning mechanism.

29. The method of claim 24, wherein the obtaining the metric indicative of conditioning mechanism performance further comprises evaluating a conditioning surface of a conditioning element of the conditioning mechanism.

30. A semiconductor substrate polishing system, comprising:
a polishing surface;
a conditioning element;
a conditioning mechanism for selectively positioning the conditioning element over the polishing surface; and
at least one sensor positioned to sense an attribute of the conditioning mechanism, wherein the at least one sensor is configured to detect a first position and a vertically offset second position of the conditioning element.

31. A semiconductor substrate polishing system, comprising:
a polishing surface;
a conditioning element;
a conditioning mechanism for selectively positioning the conditioning element over the polishing surface;
at least one sensor positioned to sense an attribute of the conditioning mechanism;
a rinse station laterally disposed from the polishing surface, the conditioning mechanism further configured to selectively position the conditioning element proximate the rinse station,
wherein the rinse station further comprises a rinse nozzle configured to spray a fluid on the conditioning element and the at least one sensor is configured to provide a metric indicative of a fluid flow through the rinse nozzle.

* * * * *

UNITED STATES PATENT AND TRADEMARK OFFICE
CERTIFICATE OF CORRECTION

| | | |
|---|---|---|
| PATENT NO. | : 7,210,981 B2 | Page 1 of 1 |
| APPLICATION NO. | : 11/273766 | |
| DATED | : May 1, 2007 | |
| INVENTOR(S) | : Yilmaz et al. | |

It is certified that error appears in the above-identified patent and that said Letters Patent is hereby corrected as shown below:

In Column 12, Claim 1, Line 10, please delete "element" and insert --mechanism--.

Signed and Sealed this

Third Day of July, 2007

JON W. DUDAS
*Director of the United States Patent and Trademark Office*